US 6,624,688 B2

(12) United States Patent
Jaussi et al.

(10) Patent No.: US 6,624,688 B2
(45) Date of Patent: Sep. 23, 2003

(54) FILTERING VARIABLE OFFSET AMPLIFER

(75) Inventors: James E. Jaussi, Hillsboro, OR (US); Bryan K. Casper, Hillsboro, OR (US); Aaron K. Martin, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/041,677

(22) Filed: Jan. 7, 2002

(65) Prior Publication Data

US 2003/0128067 A1 Jul. 10, 2003

(51) Int. Cl.⁷ .............................. H03F 3/45; H03K 5/22
(52) U.S. Cl. ..................... 327/552; 327/307; 327/355
(58) Field of Search ........................ 327/65, 307, 355, 327/359, 552, 563; 330/280, 303

(56) References Cited

U.S. PATENT DOCUMENTS

| | | | | |
|---|---|---|---|---|
| 3,916,333 A | * | 10/1975 | Zuk ............................ 330/259 |
| 4,647,839 A | * | 3/1987 | Siligoni et al. ............. 330/252 |
| 4,754,169 A | | 6/1988 | Morris ........................ 327/307 |
| 4,805,129 A | | 2/1989 | David ......................... 382/232 |
| 4,987,327 A | | 1/1991 | Fernandez et al. .......... 327/543 |
| 5,079,515 A | * | 1/1992 | Tanimoto .................... 330/256 |
| 5,148,162 A | * | 9/1992 | Crosby ........................ 327/96 |
| 5,222,240 A | | 6/1993 | Patel .......................... 712/218 |
| 5,367,476 A | | 11/1994 | Elliott ........................ 708/301 |
| 5,408,235 A | | 4/1995 | Doyle et al. ................ 341/143 |
| 5,414,311 A | | 5/1995 | Carley ........................ 327/94 |
| 5,500,811 A | | 3/1996 | Corry ......................... 708/319 |
| 5,563,598 A | | 10/1996 | Hickling ..................... 341/155 |
| 5,717,716 A | | 2/1998 | Doyle ......................... 375/232 |
| 5,777,912 A | | 7/1998 | Leung et al. ................ 708/319 |
| 5,900,779 A | * | 5/1999 | Giacomini ................... 330/252 |
| 5,903,605 A | | 5/1999 | Crittenden .................. 375/226 |
| 5,966,314 A | | 10/1999 | Lee ............................. 708/319 |
| 6,018,269 A | * | 1/2000 | Viswanathan ............... 330/254 |
| 6,064,614 A | | 5/2000 | Khoury ....................... 365/207 |
| 6,151,415 A | | 11/2000 | Acharya et al. ............ 382/255 |
| 6,163,215 A | * | 12/2000 | Shibata et al. ............. 330/254 |
| 6,209,069 B1 | | 3/2001 | Baltar ......................... 711/163 |
| 6,275,835 B1 | | 8/2001 | Pisek et al. ................ 708/300 |
| 6,288,588 B1 | * | 9/2001 | Frisch ......................... 327/280 |
| 6,348,882 B1 | | 2/2002 | Ciccone et al. ............. 341/56 |
| 6,388,521 B1 | | 5/2002 | Henry ......................... 330/258 |
| 6,396,329 B1 | * | 5/2002 | Zerbe ......................... 327/336 |
| 6,420,932 B1 | * | 7/2002 | Casper ........................ 330/258 |
| 6,469,576 B2 | * | 10/2002 | Hasegawa .................... 330/69 |

OTHER PUBLICATIONS

Farjad–Rad et al., "A 0.3–μm CMOS 8–Gb/s 4–PAM Serial Link Transceiver," *IEEE*, May 2000, 35(5):757–764.

* cited by examiner

*Primary Examiner*—Timothy P. Callahan
*Assistant Examiner*—Terry L. Englund
(74) *Attorney, Agent, or Firm*—Fish & Richardson P.C.

(57) ABSTRACT

A current summing FIR filter can be implemented with multiple differential input stages and variable tail currents. The variable tail currents can be used to appropriately weight the present and previous digital input signals. The weighted outputs of the differential transistor pairs can be summed to provide a filtered output signal. The tail currents can be advantageously varied with variable current sources or by adjustment of the relative widths of the differential transistor pairs. In other embodiments, additional differential pairs can be added to adjust for systematic offset voltages caused by process-induced variations in the structure of circuit devices or to induce a desired offset.

28 Claims, 6 Drawing Sheets

FILTERING VARIABLE OFFSET AMPLIFER

TECHNICAL FIELD

The invention relates to devices for filtering digital and analog signals and, more specifically, to Finite Impulse Response (or FIR) filters.

BACKGROUND

Digital signals preferably have relatively sharp, square wave forms representing two or more logic levels. However, line capacitance, noise and the like can cause attenuation of the digital signals and a corresponding "rounding" of the sharp transitions between logic levels. Accordingly, upon receipt of a digital signal it is often desirable to restore the signals to their original shape by de-attenuating the signal.

Similarly, analog signals are often attenuated during transmission. In a variety of applications, it is necessary or desirable to restore analog signals to their pre-transmission waveforms prior to further signal processing.

Finite impulse response (FIR) filters are widely used for various applications. One application is a discrete linear equalizer, which is used to de-attenuate digital and analog signals in communications systems and integrated circuits. Linear equalizers can be used to restore a signal by taking N samples of the signal over a discrete time window, multiplying each successive input sample $X_i$ by a weighting coefficient $A_i$, and outputting the sum of the products. The successive data outputs of an FIR filter is calculated as $$Y_1 = \sum_{i=1}^{N} A_i X_i$$

$$Y_2 = \sum_{i=1}^{N} A_i X_{i+1}$$

$$Y_3 = \sum_{i=1}^{N} A_i X_{i+2}$$

and so on. The variable N accordingly defines the number of "stages" in the FIR filter. When N=3, an FIR filter weighs the current signal against two previously received signals and outputs a weighted average digital signal. Optionally, successive samples can be included in the weighted average.

The digital signal filtering accomplished by such weighted averaging can be readily appreciated by considering a 5V digital source signal comprising data points 0V, 0V, 0V, 5V. During transmission, that signal attenuates and becomes, in a simplified example, 0V, 0V, 2.5V, 5V. A three stage FIR filter, upon receiving the 2.5V data point, can combine that data point with the weighted products of the two previously received data points. The FIR output will be less than 2.5V by a factor dictated by the weighting constants, and the attenuation of the signal will be thereby counteracted. By appropriate selection of the weighting constants $A_i$ and appropriate post-filtration amplification, the attenuated signal can be restored to its original waveform, or 0V, 0V, 0V, 5V.

Early FIR filters were implemented with shift register delay lines that accepted analog input signals. Samples of the analog signals were tapped at various points along the shift registers and the samples were weighted and summed as explained above to provide the desired output. Another approach to FIR filtration involves storing successive analog samples in sample and hold cells and applying tap weights with MDAC's (multiplying digital to analog converters) and associated shift registers that store the weighting constant operands.

A more recent approach has been to store the weighting constants and input data points in random access memory, or RAM. The constants and data points are output to a multiplier. The first product is sent to an accumulator and the next product is sent to an adder to be added to the contents of the accumulator, after which the resulting sum is returned to the accumulator. The process repeats until a pre-selected number of products are summed, at which time the contents of the accumulator are output as a filtered data point.

DESCRIPTION OF DRAWINGS

Like reference symbols in the various drawings indicate like elements.

DETAILED DESCRIPTION

A current summing FIR filter can be implemented with multiple differential input stages and variable tail currents. The variable tail currents can be used to appropriately weight the present and previous digital input signals. The weighted outputs of the differential transistor pairs can be summed to provide a filtered output signal. The tail currents can be advantageously varied with variable current sources or by adjustment of the relative widths of the differential transistor pairs. In other embodiments, additional differential pairs can be added to adjust for systematic offset voltages caused by process-induced variations in the structure of circuit devices or to induce a desired offset.

Figure 1:
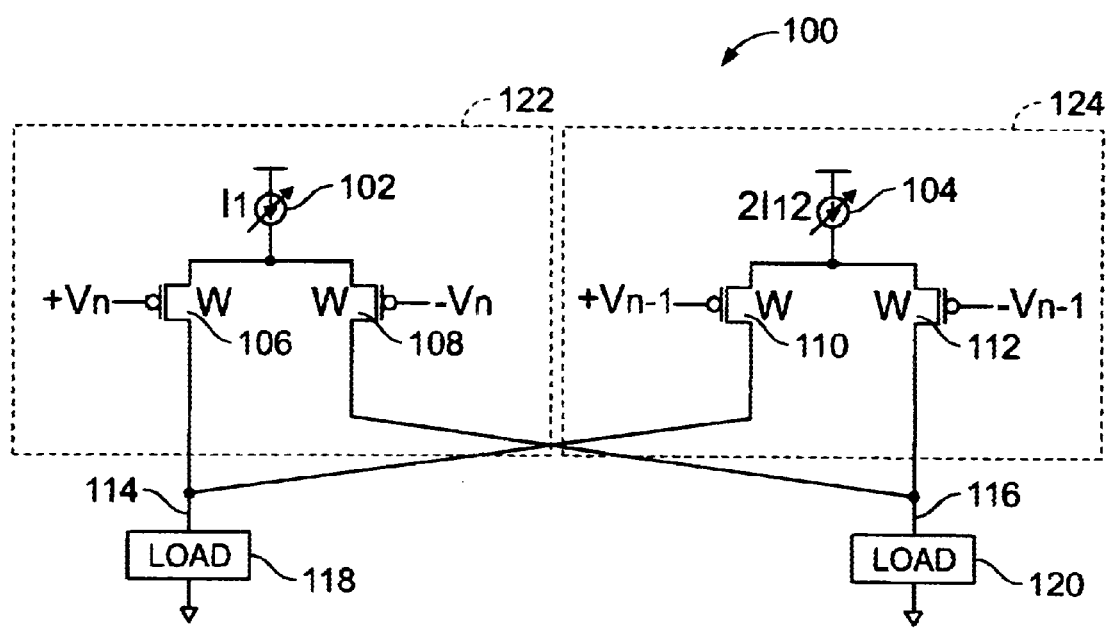
FIG. 1 is a schematic diagram of a two stage FIR filter.

FIG. 1 shows an embodiment of a differential input pair FIR filter. The filter circuit 100 includes a first differential transistor pair 106, 108 in a first stage 122 and a second differential transistor pair 110, 112 in a second stage 124. Each transistor has a channel of width W. The length of the transistor channels may be the same across all transistors in the circuit. The first and second transistor pairs can be referred to as being inter-coupled to each other because output node 114 is coupled to an output of transistor 110 from the second pair, while the output node 116 is coupled to an output node of transistor 108 from the first pair. Output nodes 114 and 116 are respectively coupled to load devices 118 and 120. These load devices can include passive and/or active circuits, depending on the application of the filter circuit. The load devices can alternatively represent a separate filter or amplification stage. The respective tail currents of the differential pairs are controlled by variable current generators 102 and 104 as shown. Other types of variable current generators to control the tail currents can alternatively be used, for example, current sinks. In this embodiment, variable current generator 102 provides half the current of current generator 104. The inputs to the gates of transistors 106, 108, 110, and 112 are $V_n^+$, $V_n^-$, $V_{n-1}^+$, and $V_{n-1}^-$, respectively, where n represents a current differential signal data point and n−1 represents the previous differential signal data point.

In operation, the inputs $V_n^+$, $V_n^-$, $V_{n-1}^+$, and $V_{n-1}^-$ are provided by, for example, an sample and hold circuit (not shown). The fact that the tail current set by generator 104 is twice that set by generator 102 dictates that the current gain for inputs $V_{n-1}^+$ and $V_{n-1}^-$ will be twice that of inputs $V_n^+$, $V_n^-$. The filter circuit 100 provides output voltages $V_{out}^+$ at node 114 and $V_{out}^-$ at node 116. The output voltages will reflect a weighting of signals n and n−1 consistent with their relative current amplification. Stated another way, in this embodiment differential input signals $V_{n-1}^+$ and $V_{n-1}^-$ are given twice the weight of differential inputs $V_n^+$, $V_n^-$.

The circuit of FIG. 1 thus serves as an FIR filter when tapped at the outputs 114, 116. The filtered output for differential signal sample n is either suppressed or amplified based on the previously received differential signal sample.

Various modifications can be readily made to the circuit of FIG. 1 to expand its functionality. Additional stages can be added to the filter to provide that input signals n−2, n−3, n+1, n+2, et cetera be factored into the filtered output $V_{out}^+$ and $V_{out}^-$. The weight afforded each input pair can be adjusted by appropriate variation of the tail current generators 102 and 104. The use of matrices to select optimal weighting coefficients is well known in the art and will not be discussed in further detail herein. Many other modifications can be made to the circuit 100, as is explained in greater detail below.

Figure 2:
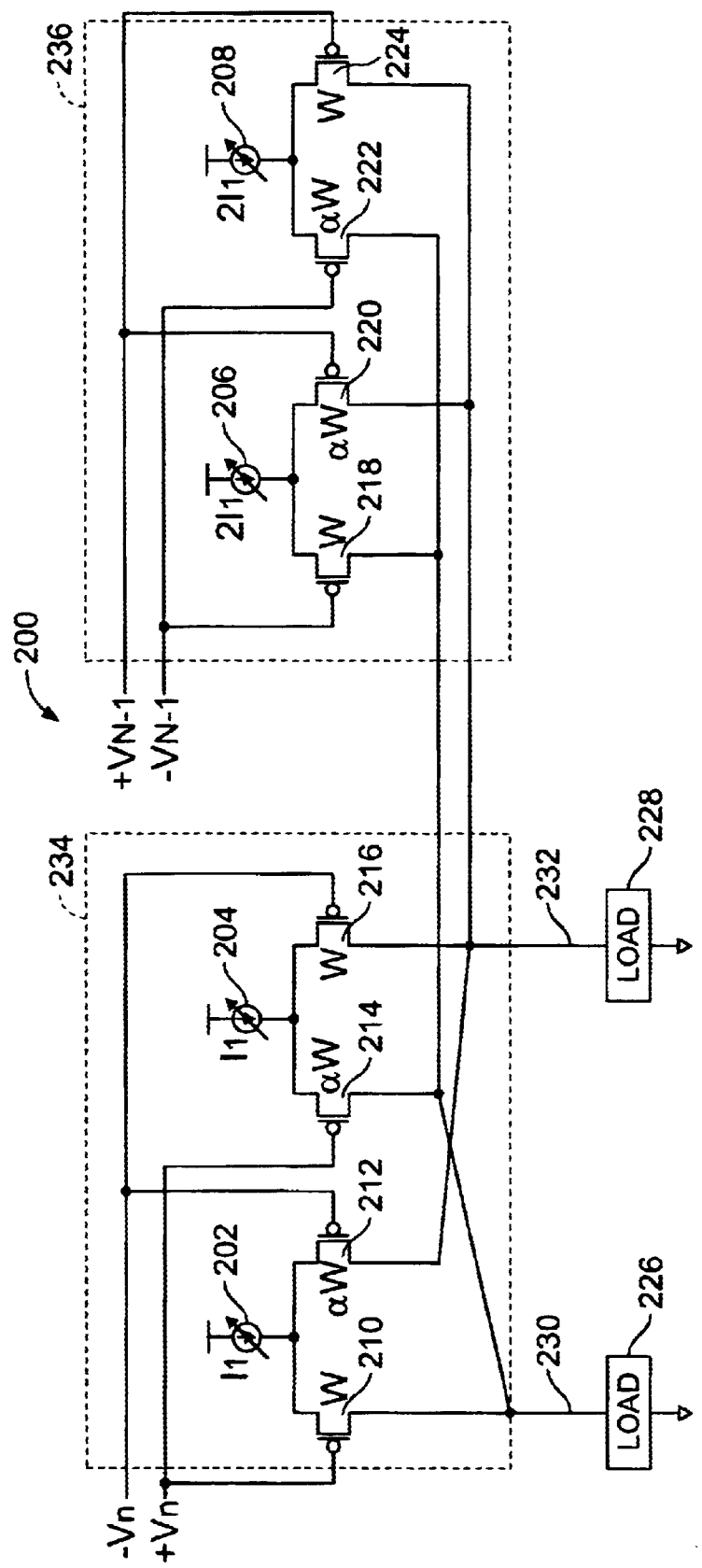
FIG. 2 is a schematic diagram of a two stage FIR filter adapted to compensate for amplifier offset.

FIG. 2 shows a filter circuit 200 that corrects for an undesired differential signal offset or provides for a desired signal offset. The embodiment of the filter circuit 200 shown in FIG. 2 is implemented using p-channel metal oxide semiconductor field effect transistors (MOSFETs), as with the circuit 100 shown in FIG. 1. The filter circuit 200 of FIG. 2 has two stages, like the filter circuit 100 of FIG. 1. However, each stage 234, 236 of the circuit 200 includes two differential transistor pairs instead of one differential transistor pair.

The first stage 234 includes variable current generator 202, which provides a tail current to transistor pair 210, 212, and a complementary current generator 204, which provides a tail current to transistor pair 214, 216. When the current of generator is 202 is increased by $\Delta I$, the current of generator 204 is decreased by $\Delta I$, and visa versa. The input to the gates of transistors 210 and 214 is $V_n^+$ and the input to the gates of transistors 212 and 216 is $V_n^-$. The widths of the gates of transistors 212 and 214 are increased (or decreased) by a factor $\alpha$.

The second stage 236 includes variable current generator 206, which provides a tail current to transistor pair 218, 220, and a complementary current generator 208, which provides a tail current to transistor pair 222, 224. When the current of generator 206 is increased by $\Delta I$, the current of generator 208 is decreased by $\Delta I$, and visa versa. The aggregate current generated by second-stage generators 206 and 208 is twice that generated by first stage generators 202 and 204 in the first stage 234. The inputs to the gates of transistors 218 and 222 is $V_{n-1}^+$ and the inputs to the gates of transistors 220 and 224 is $V_{n-1}^-$. The widths of the gates of transistors 220 and 222 are increased (or decreased) by a factor $\alpha$.

The first and second stages are inter-coupled to each other because output node 230 is coupled to an output of transistors 210, 214, 218, and 222, while the output node 232 is coupled to an output node of transistors 212, 216, 220 and 224. Output nodes 230 and 232 are respectively coupled to load devices 226 and 228. As noted above in connection with FIG. 1, these load devices can include passive and/or active circuits, depending on the application of the filter circuit. The load devices can alternatively represent a separate filter or amplification stage.

In operation, when viewed macroscopically, the first and second stages 234 and 236 function similarly to the first and second stages of the filter circuit of FIG. 1. Namely, the fact that the aggregate tail current set by the second-stage generators 206, 208 is twice that set by first-stage generators 202, 204 dictates that the current gain for inputs $V_{n-1}^+$ and $V_{n-1}^-$ will be twice that of inputs $V_n^+$, $V_n^-$. The filter circuit 200 thus provides output voltages $V_{out}^+$ at node 230 and $V_{out}^-$ at node 232. The output voltages will reflect a "weighting" of signals n and n−1 consistent with their relative current amplification, just as in the circuit of FIG. 1.

However, the circuit of FIG. 2 also removes or introduces offsets to or from the differential signals $V_n$ and $V_{n-1}$. This arises from the mismatching of the widths of the differential transistor pairs by the factor $\alpha$.

Consider the first stage 234 in an operating condition wherein $V_n^+ = V_n^-$. Also assume that the tail currents 202 and 204 are equal and the load impedances are equal. In such a configuration, the stage 234 provides a nominal offset that will appear at the output as $$V_{out}^+ - V_{out}^- = V_{nominal} = 0$$

Next, keeping the input voltages the same, if current 202 is increased and current 204 is decreased both by the same amount, namely $I_{202} + \Delta I$ and $I_{204} - \Delta I$, then $V_{out}^+$ changes to the following:

$$V_{out}^+ = \{[\alpha/(\alpha+1)][I_{202}+\Delta I]+[1/(\alpha+1)][I_{204}-\Delta I]\}R_L \quad (2)$$

Similarly, the new value of $V_{out}^-$ is given by:

$$V_{out}^- = \{[\alpha/(\alpha+1)][I_{204}-\Delta I]-[1/(\alpha+1)][I_{204}+\Delta I]\}R_L \quad (2)$$

Finally, the difference voltage $V_{out}^+ - V_{out}^-$ is given by:

$$V_{out}^+ - V_{out}^- = +[2(\alpha-1)/(\alpha+1)]\Delta I\, R_{load} \quad (4)$$

Thus, increasing $I_{202}$ and decreasing $I_{204}$ resulted in a decrease in the difference output voltage as given in the expression above. This decrease is the offset forced by the change in tail currents. Now, if the tail currents are changed in the reverse direction, that is if $I_{202}$ is decreased and $I_{204}$ is increased by the same amount, then following an analysis similar to that above gives the following expression:

$$V_{out}^+ - V_{out}^- = -[2(\alpha-1)/(\alpha+1)]\Delta I\, R_{load} \quad (5)$$

which is an offset in the output voltage that is opposite in polarity to that given by equation (4). Thus, this example illustrates how opposite polarity offsets may be obtained in proportion to a differential change in the tail currents. The net effect is that an offset dictated by $\Delta I$ and $\alpha$ is imposed upon or removed from the signals $V_n^+$, $V_n^-$ at the first stage 234.

This same effect is observed in the second stage 236 when current 206 is changed by $\Delta I$ and current 208 is changed by $-\Delta I$. Accordingly, the offset dictated by $\Delta I$ and $\alpha$ is imposed or removed from the signals $V_{n-1}^+$, $V_{n-1}^-$ at the second stage 236.

The circuit 200 thus serves both as a FIR filter and as a variable offset amplifier. The differential signals $V_{n-1}$ and $V_n$ are weighted by the ratio between the average tail currents in the first and second stages. At the same time, offset is imposed upon the two differential input signal pairs $V_n^+, V_n^-$ and $V_{n-1}^+, V_{n-1}^-$.

Figure 3:
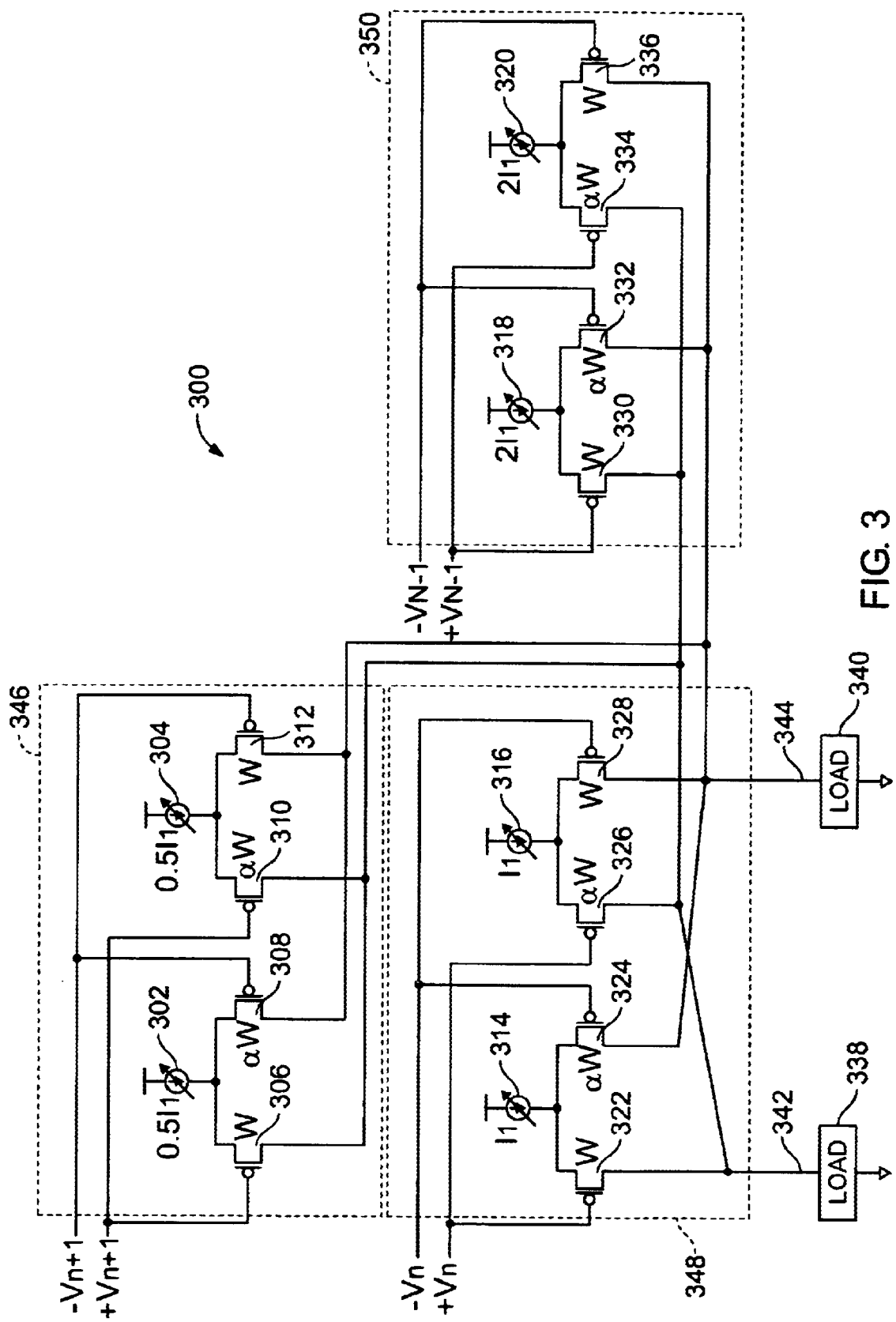
FIG. 3 is a schematic diagram of a three stage FIR filter embodiment adapted to compensate for amplifier offset.

FIG. 3 shows a three-stage filter circuit 300 that is similar to circuit 200 except that an additional stage 346 is added to include the differential signal $V_{n+1}$ in the filtration process.

The first stage 348 includes variable current generator 314, which provides a tail current to transistor pair 322, 324, and a complementary current generator 316, which provides a tail current to transistor pair 326, 328. When the current of generator 314 is increased by ΔI, the current of generator 316 is decreased by ΔI, and visa versa. The inputs to the gates of transistors 322 and 326 is $V_n^+$ and the inputs to the gates of transistors 324 and 328 is $V_n^-$. The widths of the gates of transistors 324 and 326 are increased (or decreased) by a factor α.

The second stage 350 includes variable current generator 318, which provides a tail current to transistor pair 330, 332, and a complementary current generator 320, which provides a tail current to transistor pair 334, 336. When the current of generator 318 is increased by ΔI, the current of generator 320 is decreased by ΔI, and visa versa. The average current generated by second-stage generators 318 and 320 is twice that generated by first stage generators 314 and 316 in the first stage 348. The inputs to the gates of transistors 330 and 334 is $V_{n-1}^+$ and the inputs to the gates of transistors 332 and 336 is $V_{n-1}^-$. The widths of the gates of transistors 332 and 334 are increased (or decreased) by a factor α.

The third stage 346 includes variable current generator 302, which provides a tail current to transistor pair 306, 308, and a complementary current generator 304, which provides a tail current to transistor pair 310, 312. When the current of generator 302 is increased by ΔI, the current of generator 304 is decreased by ΔI, and visa versa. The average current generated by third-stage generators 302 and 304 is half that generated by first stage generators 314 and 316 in the first stage 348. The inputs to the gates of transistors 306 and 310 is $V_{+1}^+$ and the inputs to the gates of transistors 308 and 312 is $V_{+1}^-$. The widths of the gates of transistors 308 and 310 are increased (or decreased) by a factor α.

The first, second and third stages are inter-coupled to each other because output node 342 is coupled to an output of transistors 306, 310, 322, 326, 330 and 334, while the output node 344 is coupled to an output node of transistors 308, 312, 324, 328, 332, and 336. Output nodes 342 and 344 are respectively coupled to load devices 338 and 340. As noted above in connection with FIGS. 1 and 2, these load devices can include passive and/or active circuits, depending on the application of the filter circuit, and the load devices can alternatively represent a separate filter or amplification stage.

The operation of the circuit 300 is similar to that of circuit 200 except that differential signal $V_{n+1}$ is weighted and factored into the output signals 342, 344. In this embodiment, $V_{n+1}$ is afforded half the weight of signal $V_n$ and a quarter the weight afforded signal $V_{n-1}$. The operation of circuit 300 also differs in that offset is also imposed upon the differential input signal pair $V_{n+1}^+, V_{n+1}^-$, as dictated by ΔI and α.

As can be readily appreciated from the foregoing, any desired number of stages can be added to permit filtration of additional data points. Similarly, any desired weighting factor can be applied amongst sequential data points $V_{n-1}$, $V_n$, $V_{n+1}$, et cetera, by appropriate selection of tail currents. Any desired offset can be applied to each differential input pair by appropriate selection of ΔI and α.

Figure 4:
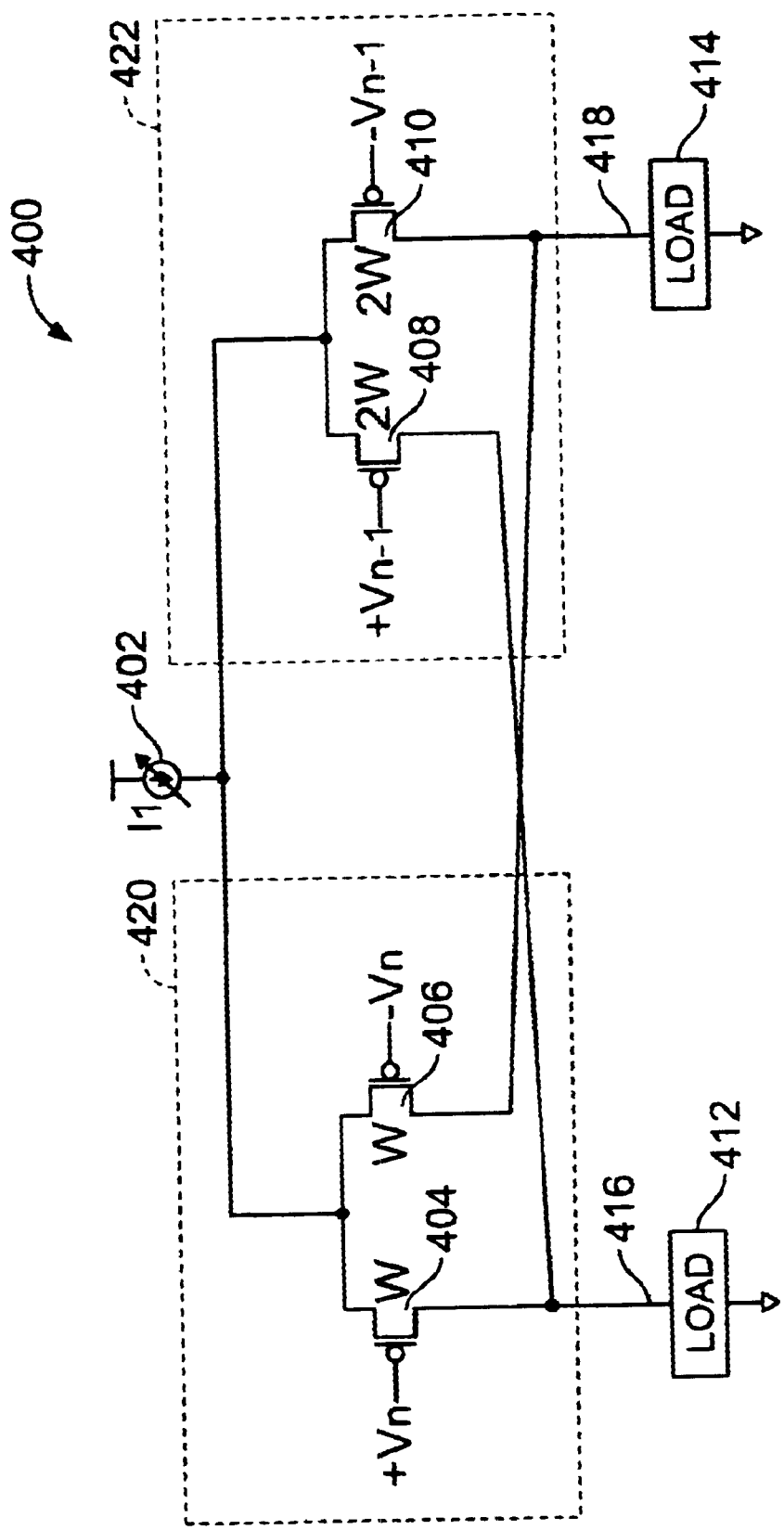
FIG. 4 is a schematic diagram of a two stage FIR filter having a single variable current source.

The circuit of FIG. 4 reflects another modification to the filter circuit of FIG. 1. Filter circuit 400 operates similarly to circuit 100 except that the tail current of second stage 422 is controlled by varying the widths of the channels of the second stage transistors instead of varying an independent current source.

Current source 402 feeds both the first stage differential transistor pair 404, 406 and second stage transistor pair 408, 410. Circuit elements 404 to 414 and their connections are similar to elements 106 to 120 in FIG. 1 and need not be explained further herein, except to say that, the widths of first stage differential transistor pair 404, 406 are half that of the second stage transistor pair 408, 410.

In operation, the first and second stages 420 and 422 function similarly to the first and second stages of the filter circuit of FIG. 1. Namely, the fact that the aggregate tail current set by the width of second-stage transistors 408, 410 is twice that set by the width of first-stage transistors 404, 406 dictates that inputs $V_{n-1}^+$ and $V_{n-1}^-$ will be amplified twice as much as inputs $V_n^+, V_n^-$. The filter circuit 400 thus provides output voltages $V_{out}^+$ at node 416 and $V_{out}^-$ at node 418. The output voltages will reflect a "weighting" of signals n and n−1 consistent with their relative amplification, just as in the circuit of FIG. 1.

Figure 5:
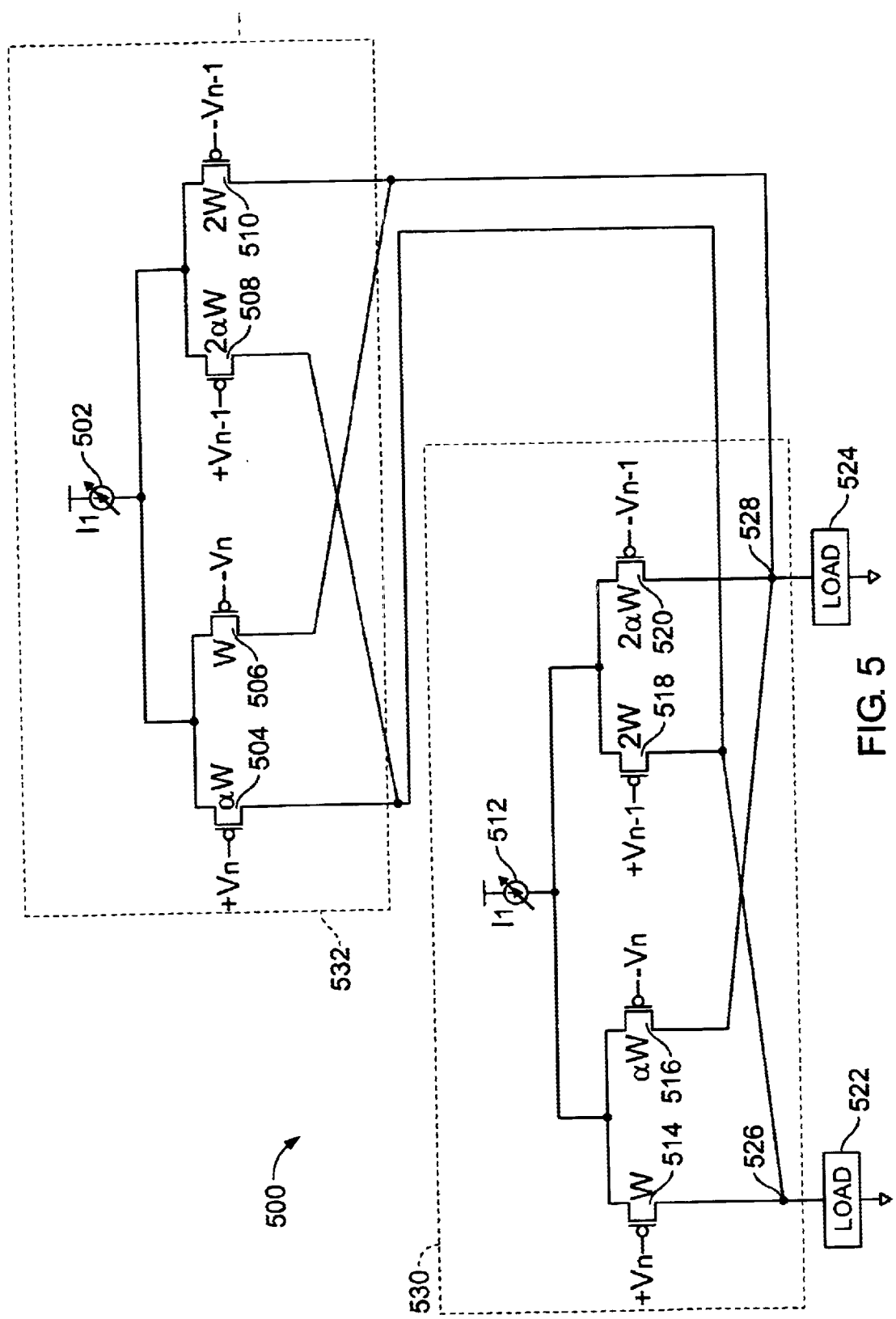
FIG. 5 is a schematic diagram of a two stage FIR filter having a single variable current source and adapted to compensate for amplifier offset.

The circuit of FIG. 5 reflects a modified version of the circuit of FIG. 4 that permits variable offset control. The circuit of FIG. 5 is comprised of two sub-circuits 530, 532 having the same basic topology as circuit 400 inter-coupled to one another in the same fashion discussed above. The only difference between each of the sub-circuits 530, 532 and the circuit 400 is that widths of the certain of the differential transistor pairs are adjusted by factor α. The currents fed into the sub-circuits 530, 532 are complimentary in the sense that, when the current of generator 512 is increased by ΔI, the current of generator 502 is decreased by ΔI, and visa versa. The remaining aspects of components 502–528 are similar to the parallel components 402–418 already described above in connection with FIG. 4.

In operation, the sub-circuits 530 and 532 of filter circuit 500 function similarly to filter circuit 400. Differential signal $V_{n-1}$ is given twice the weight of signal $V_n$ before it is summed with $V_n$ at output nodes 526, 528. However, the circuit 500 also removes or introduces offsets to or from the differential signals $V_n$ and $V_{n-1}$ as dictated by ΔI and Δ, and the teachings set forth above. The factor αy applied at transistors 504 and 516 controls the relative offset applied to the differential signal $V_n$ and the offset factor α applied at transistors 508 and 520 controls the relative offset applied to the differential signal $V_{n-1}$.

Many other modifications can be made to the circuits of FIGS. 1–5 in accordance with the teachings set forth herein. For instance, the current differentials can be provided by digitally controlled current sources. A single current source may be tapped in various locations to provide varied tail currents. The relative location of the loads and current sources can be switched by tying the loads to Vcc and implementing current sinks. Non-integer weighting factors and offset factors a can be realized by appropriate manipulation of current sources, transistor widths, passive circuit element parameters, or any other parameter that affects output node voltage in a particular circuit topology. Furthermore, negative weighting factors can be advantageously provided by switching the input terminals (e.g. switching $V_n^+$ and $V_n^-$ such that they bias the other FET in the differential pair). The offset factor can be realized by altering one or both of the channel widths or lengths of the differential transistor pairs. Similarly, the weighting factor can be realized by altering one, some or all of the channel widths or lengths of the inter-coupled transistors. The weighting factor can also be realized by altering one, some, or all of the tail currents feeding into each stage. The number of data points sampled (N) and the number of stages can be selected to obtain optimum filtration while minimizing hardware cost. The filter circuits of the instant invention can be integrated into an analog filtering stage, which additionally reduces complexity and increases operating speed. Additional devices such as common mode feedback devices can be advantageously added to the filter circuits of the instant invention. By appropriate selection of the loads, the filter can additionally provide a desired amplification of the differential input signals. Moreover, the range in which the relationship between $V_{in}$ and $I_{out}$ is linear can be advantageously broadened by adding degenerating resistances between the current sources and differential pairs. Many other such modifications can be readily made to adapt the instant control circuit to other circuit environments.

Figure 6:
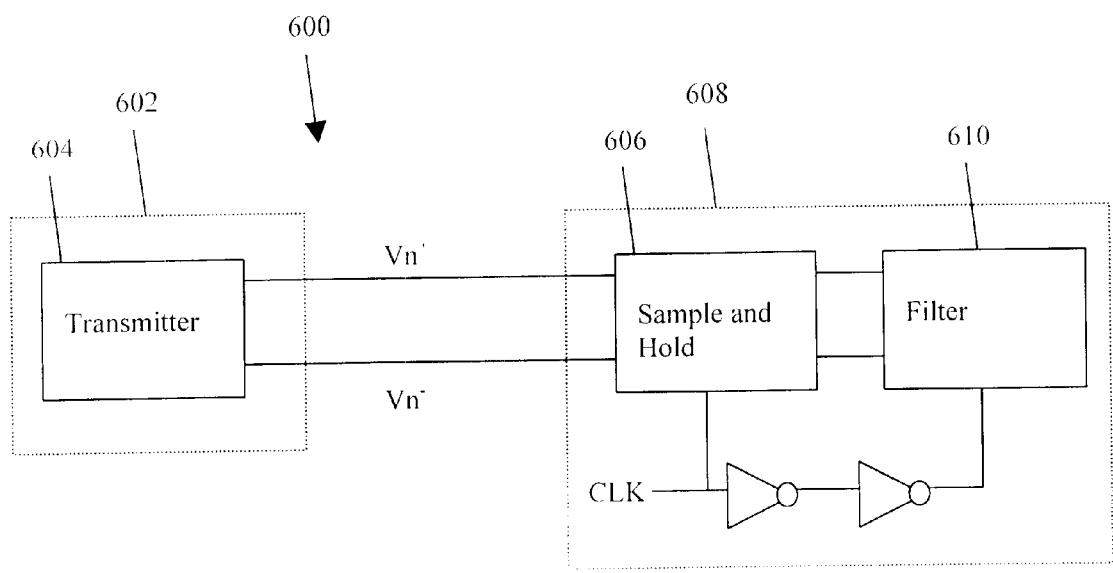
FIG. 6 is a schematic diagram a communications system including an FIR filter.
Figure 1:
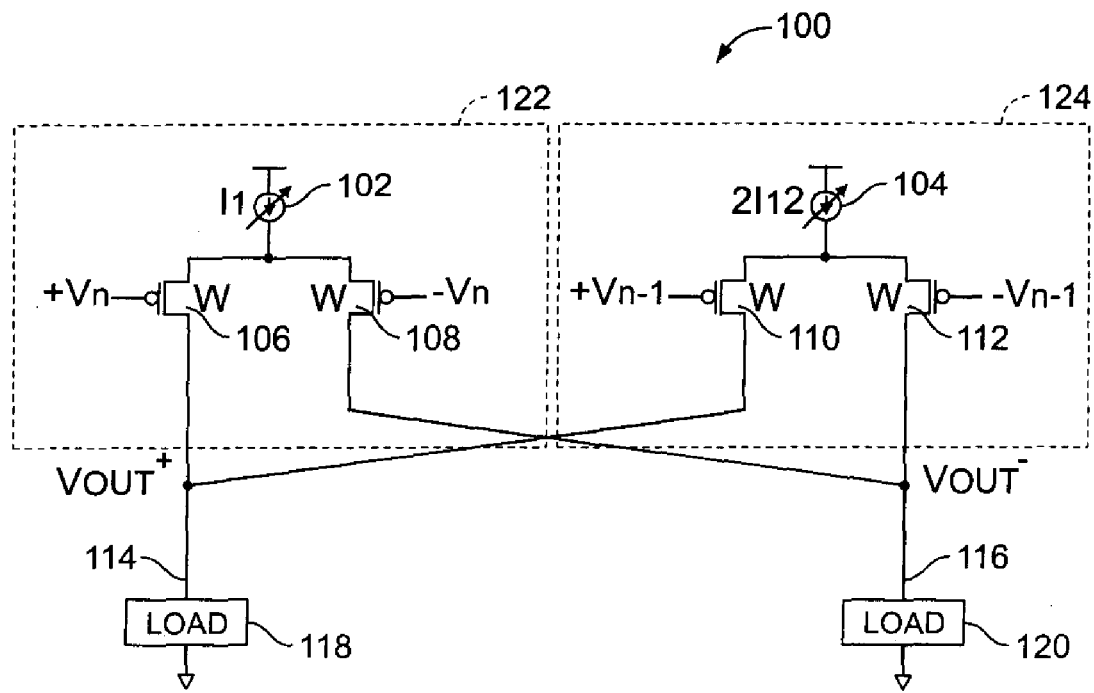
Figure 2:
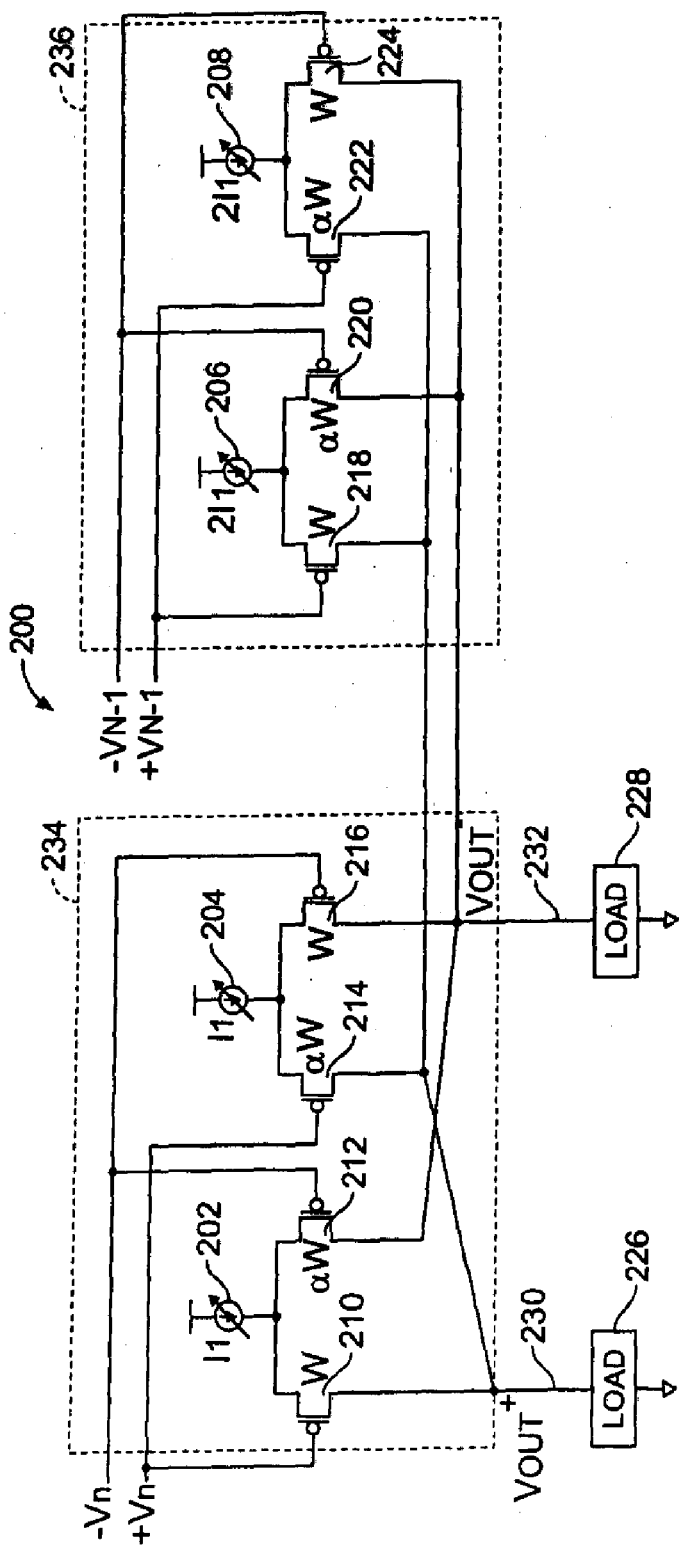
Figure 3:
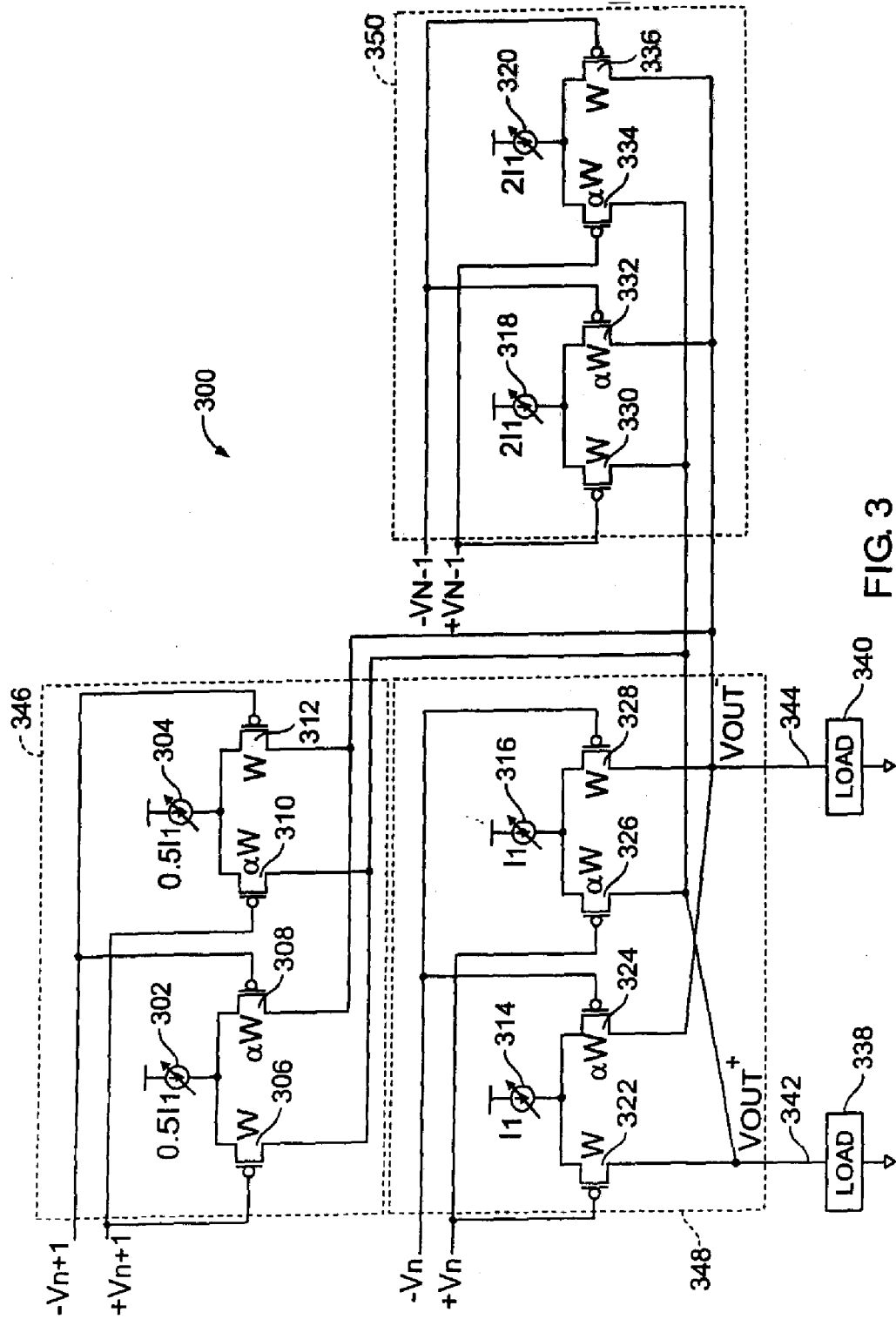
Figure 5:
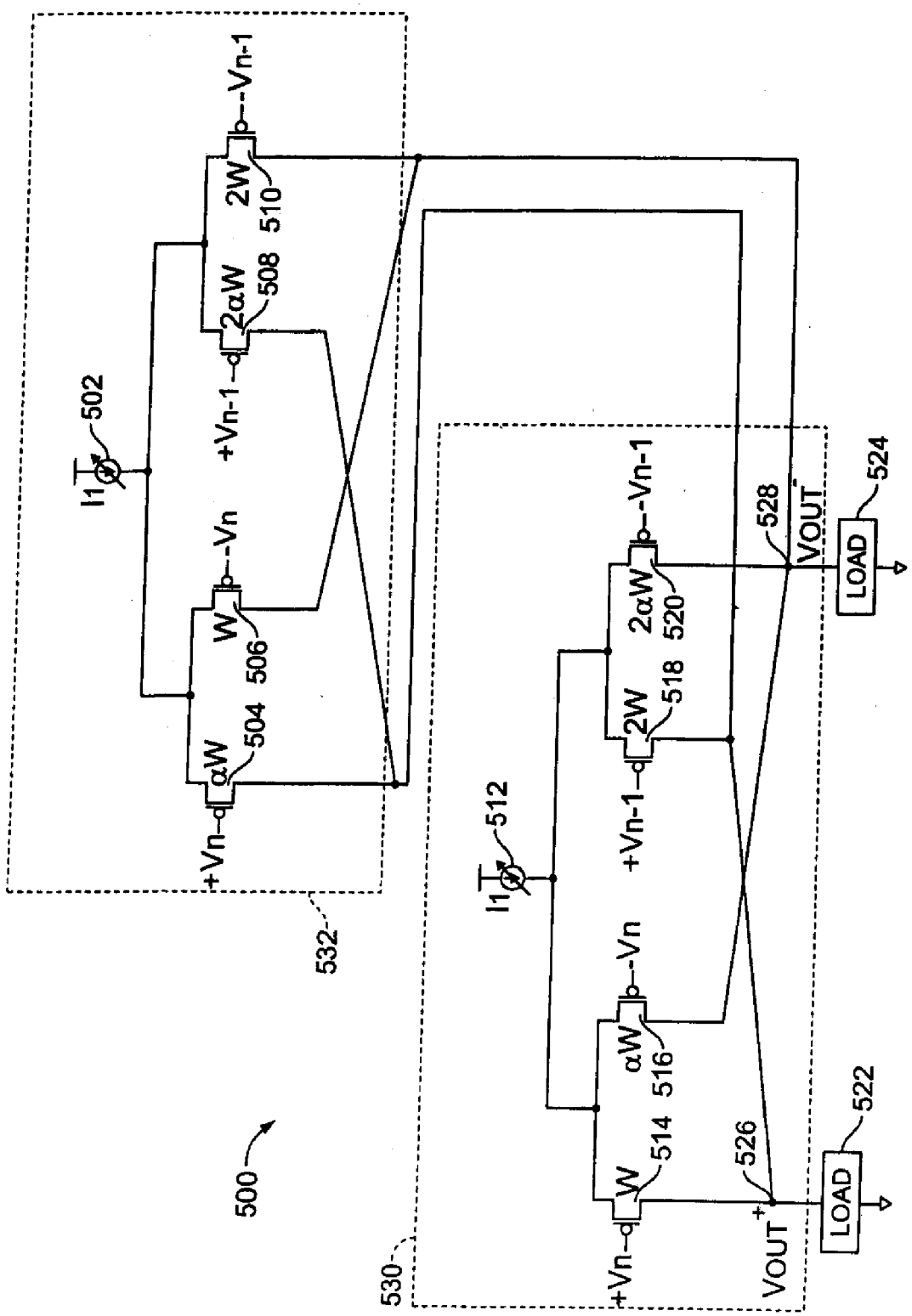

FIG. 6 shows a communications system 600 having the filter of FIGS. 1–5 in a communications application. The transmission end of the signal to be sensed may reside on a separate integrated circuit die or separate circuit board, for example, as depicted by block 602 having a transmitter 604 with differential outputs $Vn^+$ and $Vn^-$. These differential output signals are received by a sample-and-hold circuit 606 that may reside, as shown in FIG. 6, on a separate integrated circuit die or separate board as depicted by block 608. A clock signal CLK determines the timing of when the differential signal is sampled, and a delayed clock signal determines the timing of when the sampled-and-held differential signal is filtered by circuit 610.

Aspects of the invention provide for one or more of the following advantages. In selected embodiments, the invention provides a filter circuit that serves simultaneously as an FIR filter and a variable offset amplifier. In certain embodiments, the digital signal processing requirements are significantly reduced in comparison to previous designs. In some embodiments, the circuit has improved common mode rejection ration and power supply rejection ration compared to other designs of such circuits, which permits sampling and filtration of an increased number of differential input data points. In still other embodiments, the filter can be integrated into an analog filtering stage, as noted above, which in turn reduces complexity and increases operating speed.

A number of embodiments have been described. Nevertheless, it will be understood that various modifications may be made without departing from the spirit and scope of the invention. Accordingly, other embodiments are within the scope of the following claims.

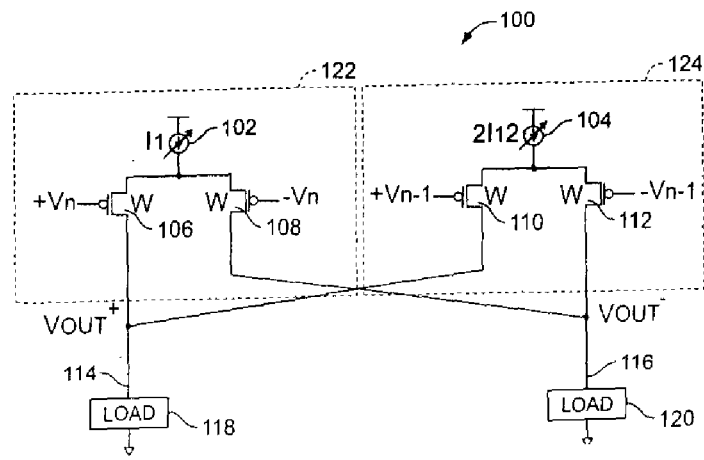

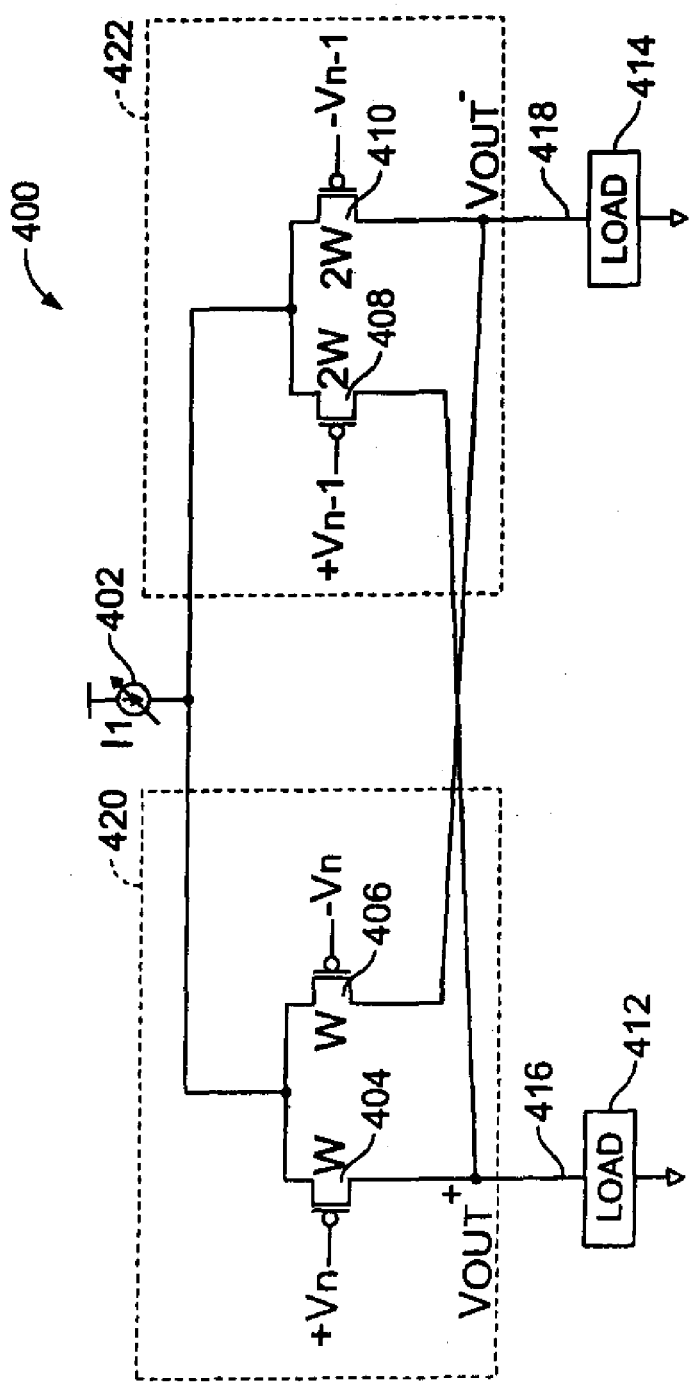

What is claimed is:

1. A filtering method comprising:
   receiving first and second differential inputs, the second input having been received prior to the first input;
   biasing first and second differential input pairs with the first and second differential inputs, respectively;
   weighting the first and second differential inputs by modulating a gain of at least one of the differential input pairs; and
   tapping first and second output nodes to obtain a filtered signal, wherein the first and second output nodes are connected to transistors of the differential input pairs which are biased by inverted inputs and non-inverted inputs, respectively.

2. The method of claim 1, wherein the output nodes are coupled to at least one load selected from the group consisting of a regenerative latch, a passive load, an active filter, and an amplifier.

3. The method of claim 1, wherein the gain is modulated by altering tail currents of the differential input pairs.

4. The method of claim 1, wherein the gain is modulated by altering tail currents provided by a plurality of variably controlled current sources.

5. The method of claim 1, wherein the gain is modulated by altering widths of the channels of the transistors.

6. The method of claim 1, further comprising inducing an offset by connecting first and second offset-inducing differential input pairs in parallel to the first and second differential input pairs, wherein transistor channel widths in at least one differential input pair are mismatched.

7. The method of claim 6, further comprising inducing an offset in a third differential input, the third differential input having been received after the first differential input.

8. The method of claim 6, further comprising equally and oppositely offsetting tail currents of the first and second offset-inducing differential input pairs from a nominal current level relative to tail currents for the first or second differential input pairs, respectively.

9. The method circuit of claim 1, wherein the filtered signal is also amplified and offset.

10. The method of claim 1, wherein the transistors of the differential input pairs are p-channel MOSFET transistors.

11. The method of claim 1, further comprising receiving a third differential input, the third differential input having been received after the first differential input, biasing a third differential input pair with the third differential input, and weighting the third differential input by modulating the gain of at least one of the differential input pairs.

12. A communications system comprising:
   (a) a transmitter producing a differential voltage signal;
   (b) a receiver comprising:
      (1) a sample-and-hold circuit that receives the differential voltage signal and samples and holds values of the differential voltage signal; and
      (2) a filter circuit comprising:
         a first differential transistor pair biased by a first differential input received from the sample-and-hold circuit;
      a second differential transistor pair biased by a second differential input, the second differential input having been received from the sample-and-hold circuit prior to the first differential input;
      at least one current source coupled to provide tail currents for the differential transistor pairs;
      wherein the transistors which are biased by present and previous inverted inputs have a first output terminal; and
      wherein the transistors which are biased by present and previous non-inverted inputs have a second output terminal.

13. The communications system of claim 12, wherein the transmitter and the receiver reside on different circuit boards.

14. The communications system of claim 12, wherein the transmitter and the receiver reside on different integrated circuit die.

15. The communications system of claim 12, wherein the filter circuit further comprises first and second offset-inducing differential transistor pairs connected in parallel to the first and second differential transistor pairs, respectively, wherein the channel widths of the transistors in each differential transistor pair are not equal and wherein the difference in channel width in the offset-inducing differential transistor pairs is opposite that of the first and second differential transistor pairs.

16. A filter circuit comprising:
   a first differential transistor pair biased by a first differential input;
   a second differential transistor pair biased by a second differential input, the second differential input having been received prior to the first differential input;

at least one current source coupled to provide tail currents for the differential transistor pairs, said tail current of the first differential transistor pair being different from said tail current of the second differential transistor pair;

wherein the transistors which are biased by present and previous inverted inputs have a first output node;

wherein the transistors which are biased by present and previous non-inverted inputs have a second output node; and wherein the tail current differential is provided by a difference in channel widths between the first and second differential transistor pairs.

17. The filter circuit of claim 16, wherein the output nodes are coupled to at least one load selected from the group consisting of a regenerative latch, a passive load, an active filter, and an amplifier.

18. The filter circuit of claim 16, wherein the tail currents are provided by a plurality of variably controlled current sources.

19. The filter circuit of claim 16, wherein the output nodes provide an amplified, offset and filtered differential signal.

20. A filter circuit comprising:

a first differential transistor pair biased by a first differential input;

a second differential transistor pair biased by a second differential input, the second differential input having been received prior to the first differential input;

at least one current source coupled to provide tail currents for the differential transistor pairs;

first and second offset-inducing differential pairs connected in parallel to the first and second differential transistor pairs, respectively;

wherein the transistors which are biased by present and previous inverted inputs have a first output node; and wherein the transistors which are biased by present and previous non-inverted inputs have a second output node.

21. The filter circuit of claim 20, wherein channel widths of the transistors in each differential transistor pair are not equal and wherein the difference in channel width in the offset-inducing differential pairs is opposite that of the first and second differential transistor pairs.

22. The filter circuit of claim 21, wherein the tail currents for the first and second offset-inducing differential pairs are equally and oppositely offset from a nominal current level relative to the tail current for the first or second differential transistor pairs, respectively.

23. The filter circuit of claim 22, wherein the output nodes provide an amplified, offset and filtered differential signal.

24. The filter circuit of claim 20, wherein the output nodes provide an amplified, offset and filtered differential signal.

25. A filter circuit comprising:

a first differential transistor pair biased by a first differential input;

a second differential transistor pair biased by a second differential input, the second differential input having been received prior to the first differential input;

at least one current source coupled to provide tail currents for the differential transistor pairs;

wherein the transistors which are biased by present and previous inverted inputs have a first output node;

wherein the transistors which are biased by present and previous non-inverted inputs have a second output node; end wherein the transistors of the differential transistor pairs are p-channel MOSFET transistors; and wherein a filtered output signal is provided at the output nodes.

26. The filter circuit of claim 25, wherein the output nodes provide an amplified, offset and filtered differential signal.

27. A filter circuit comprising:

a first differential transistor pair biased by a first differential input;

a second differential transistor pair biased by a second differential input, the second differential input having been received prior to the first differential input;

a third differential transistor pair being biased by a third differential input received after the first differential input;

at least one current source coupled to provide tail currents for the differential transistor pairs;

wherein the transistors which are biased by present and previous inverted inputs have a first output node; and wherein the transistors which are biased by present and previous non-inverted inputs have a second output node.

28. The filter circuit of claim 27, wherein the output nodes provide an amplified, offset and filtered differential signal.

* * * * *

UNITED STATES PATENT AND TRADEMARK OFFICE
CERTIFICATE OF CORRECTION

PATENT NO.    : 6,624,688 B2
DATED         : September 23, 2003
INVENTOR(S)   : James E. Jaussi et al.

It is certified that error appears in the above-identified patent and that said Letters Patent is hereby corrected as shown below:

The Title page, showing an Illustrative figure, should be deleted and substitute therefore the attached title page.

Delete drawing sheet(s) 1-5 of 6, and substitute therefore the drawing sheet(s) consisting of Fig(s) 1-5 as shown on the attached pages.

Signed and Sealed this

Twenty-eighth Day of June, 2005

JON W. DUDAS
*Director of the United States Patent and Trademark Office*

(12) United States Patent
Jaussi et al.

(10) Patent No.: US 6,624,688 B2
(45) Date of Patent: Sep. 23, 2003

(54) FILTERING VARIABLE OFFSET AMPLIFER

(75) Inventors: James E. Jaussi, Hillsboro, OR (US);
Bryan K. Casper, Hillsboro, OR (US);
Aaron K. Martin, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/041,677

(22) Filed: Jan. 7, 2002

(65) Prior Publication Data

US 2003/0128067 A1 Jul. 10, 2003

(51) Int. Cl.⁷ .............................. H03F 3/45; H03K 5/22
(52) U.S. Cl. .................. 327/552; 327/307; 327/355
(58) Field of Search ................ 327/65, 307, 355, 327/359, 552, 563; 330/280, 303

(56) References Cited

U.S. PATENT DOCUMENTS

| | | | |
|---|---|---|---|
| 3,916,333 A | * 10/1975 | Zuk | 330/259 |
| 4,647,839 A | * 3/1987 | Siligoni et al. | 330/252 |
| 4,754,169 A | 6/1988 | Morris | 327/307 |
| 4,805,129 A | 2/1989 | David | 382/232 |
| 4,987,327 A | 1/1991 | Fernandez et al. | 327/543 |
| 5,079,515 A | * 1/1992 | Tanimoto | 330/256 |
| 5,148,162 A | * 9/1992 | Crosby | 327/96 |
| 5,222,240 A | 6/1993 | Patel | 712/218 |
| 5,367,476 A | 11/1994 | Elliott | 708/301 |
| 5,408,235 A | 4/1995 | Doyle et al. | 341/143 |
| 5,414,311 A | 5/1995 | Carley | 327/94 |
| 5,500,811 A | 3/1996 | Corry | 708/319 |
| 5,563,598 A | 10/1996 | Hickling | 341/155 |
| 5,717,716 A | 2/1998 | Doyle | 375/232 |
| 5,777,912 A | 7/1998 | Leung et al. | 708/319 |
| 5,900,779 A | * 5/1999 | Giacomini | 330/252 |
| 5,903,605 A | 5/1999 | Crittenden | 375/226 |
| 5,966,314 A | 10/1999 | Lee | 708/319 |
| 6,018,269 A | * 1/2000 | Viswanathan | 330/254 |
| 6,064,614 A | 5/2000 | Khoury | 365/207 |
| 6,151,415 A | 11/2000 | Acharya et al. | 382/255 |
| 6,163,215 A | * 12/2000 | Shibata et al. | 330/254 |
| 6,209,069 B1 | 3/2001 | Baltar | 711/163 |
| 6,275,835 B1 | 8/2001 | Pisek et al. | 708/300 |
| 6,288,588 B1 | * 9/2001 | Frisch | 327/280 |
| 6,348,882 B1 | 2/2002 | Ciccone et al. | 341/56 |
| 6,388,521 B1 | 5/2002 | Henry | 330/258 |
| 6,396,329 B1 | * 5/2002 | Zerbe | 327/336 |
| 6,420,932 B1 | * 7/2002 | Casper | 330/258 |
| 6,469,576 B2 | * 10/2002 | Hasegawa | 330/69 |

OTHER PUBLICATIONS

Farjad–Rad et al., "A 0.3–μm CMOS 8–Gb/s 4–PAM Serial Link Transceiver," *IEEE*, May 2000, 35(5):757–764.

* cited by examiner

*Primary Examiner*—Timothy P. Callahan
*Assistant Examiner*—Terry L. Englund
(74) *Attorney, Agent, or Firm*—Fish & Richardson P.C.

(57) ABSTRACT

A current summing FIR filter can be implemented with multiple differential input stages and variable tail currents. The variable tail currents can be used to appropriately weight the present and previous digital input signals. The weighted outputs of the differential transistor pairs can be summed to provide a filtered output signal. The tail currents can be advantageously varied with variable current sources or by adjustment of the relative widths of the differential transistor pairs. In other embodiments, additional differential pairs can be added to adjust for systematic offset voltages caused by process-induced variations in the structure of circuit devices or to induce a desired offset.

28 Claims, 6 Drawing Sheets